United States Patent
Jeong et al.

(10) Patent No.: US 10,910,406 B2
(45) Date of Patent: Feb. 2, 2021

(54) DISPLAY APPARATUS HAVING A SUBSTRATE INCLUDING A POLYMER RESIN AND METHOD OF MANUFACTURING THE SAME

(71) Applicant: SAMSUNG DISPLAY CO., LTD., Yongin-si (KR)

(72) Inventors: Jaewoo Jeong, Yongin-si (KR); Taewook Kang, Yongin-si (KR); Jongoh Seo, Yongin-si (KR); Byungsoo So, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/381,495

(22) Filed: Apr. 11, 2019

(65) Prior Publication Data

US 2019/0319050 A1  Oct. 17, 2019

(30) Foreign Application Priority Data

Apr. 12, 2018  (KR) .................. 10-2018-0042913

(51) Int. Cl.
*H01L 27/12*  (2006.01)

(52) U.S. Cl.
CPC ...... *H01L 27/1218* (2013.01); *H01L 27/1262* (2013.01)

(58) Field of Classification Search
CPC ... H01L 33/486; H01L 33/502; H01L 33/505; H01L 33/507; H01L 33/54; H01L 33/56; H01L 2933/0041
See application file for complete search history.

(56) References Cited

U.S. PATENT DOCUMENTS

| | | | |
|---|---|---|---|
| 9,076,746 B2 | 7/2015 | Chung et al. | |
| 9,548,343 B2 | 1/2017 | Kang | |
| 9,666,813 B2 | 5/2017 | Lee | |
| 2003/0077886 A1* | 4/2003 | Machida | H01L 21/223 438/535 |
| 2013/0267059 A1* | 10/2013 | Kim | H01L 31/0682 438/87 |
| 2014/0103462 A1* | 4/2014 | Lee | G01P 15/0802 257/415 |
| 2016/0293884 A1* | 10/2016 | Zhang | H05B 45/60 |
| 2018/0067597 A1* | 3/2018 | Kim | G06F 3/044 |

FOREIGN PATENT DOCUMENTS

| | | |
|---|---|---|
| KR | 10-2010-0052174 | 5/2010 |
| KR | 10-2014-0137704 | 12/2014 |
| KR | 10-2015-0052645 | 5/2015 |
| KR | 10-2015-006015 | 6/2015 |
| KR | 10-2015-0092399 | 8/2015 |

* cited by examiner

*Primary Examiner* — Telly D Green
*Assistant Examiner* — Andre C Stevenson
(74) *Attorney, Agent, or Firm* — F. Chau & Associates, LLC

(57) ABSTRACT

A display apparatus includes a substrate including a polymer resin. A portion of the substrate including an upper surface of the substrate is doped with $1\times10^{20}$ to $1\times10^{23}$ dopants per 1 $cm^3$. A barrier layer is positioned above the upper surface of the substrate. A buffer layer is positioned above the barrier layer. A thin film transistor is positioned above the buffer layer. A display device is electrically connected to the thin film transistor.

22 Claims, 3 Drawing Sheets

DISPLAY APPARATUS HAVING A SUBSTRATE INCLUDING A POLYMER RESIN AND METHOD OF MANUFACTURING THE SAME

CROSS-REFERENCE TO RELATED APPLICATION

This application claims priority under 35 U.S.C. § 119 to Korean Patent Application No. 10-2018-0042913, filed on Apr. 12, 2018, in the Korean Intellectual Property Office, the disclosure of which is incorporated by reference herein in its entirety.

1. TECHNICAL FIELD

Exemplary embodiments of the present invention relate to a display apparatus having a substrate including a polymer resin, and more particularly, to a method of manufacturing the display apparatus.

2. DISCUSSION OF RELATED ART

Generally, display apparatuses are apparatuses that implement images by using display devices arranged on a substrate. To enhance image quality in a display apparatus, when the same electrical signal is applied to the display devices, light of substantially the same brightness may be emitted from the display devices. If light of different brightness is emitted from the display devices even if the same electrical signal is applied to the display devices, image quality may be reduced.

However, in general display apparatuses, even if the same electrical signal is applied to display devices, the brightness of light emitted from the display devices may vary depending on conditions.

SUMMARY

An exemplary embodiment of the present invention provides a display apparatus capable of increasing image quality and a method of manufacturing the display apparatus.

According to an exemplary embodiment of the present invention, a display apparatus includes a substrate including a polymer resin. A portion of the substrate including an upper surface of the substrate is doped with $1\times10^{20}$ to $1\times10^{23}$ dopants per 1 $cm^3$. A barrier layer is over the upper surface of the substrate. A buffer layer is over the barrier layer. A thin film transistor is over the buffer layer. A display device is electrically connected to the thin film transistor.

The substrate may include a first polymer resin layer, a second polymer resin layer, and a basic barrier layer between the first polymer resin layer and the second polymer resin layer. The second polymer resin layer may be closer to the barrier layer than the first polymer resin layer. A portion of the second polymer resin layer including an upper surface of the second polymer resin layer may be doped with $1\times10^{20}$ to $1\times10^{23}$ dopants per 1 $cm^3$.

The substrate may include a first polymer resin layer, a second polymer resin layer, and a basic barrier layer between the first polymer resin layer and the second polymer resin layer. The second polymer resin layer may be closer to the barrier layer than the first polymer resin layer. The second polymer resin layer may be substantially completely doped with $1\times10^{20}$ to $1\times10^{23}$ dopants per 1 $cm^3$.

The barrier layer may include silicon nitride and the buffer layer may include silicon oxide.

According to an exemplary embodiment of the present invention, a display apparatus includes a substrate including a polymer resin. A buffer layer is positioned above the substrate. A polysilicon layer is between the substrate and the buffer layer. The polysilicon layer is doped with $1\times10^{20}$ to $1\times10^{23}$ dopants per 1 $cm^3$. A thin film transistor is positioned above the buffer layer. A display device is electrically connected to the thin film transistor.

The display apparatus may include an inorganic insulating layer between the polysilicon layer and the substrate.

The display apparatus may include a barrier layer between the buffer layer and the polysilicon layer.

The display apparatus may include a barrier layer between the polysilicon layer and the substrate.

The display apparatus may include an inorganic insulating layer between the polysilicon layer and the barrier layer.

A thickness of the polysilicon layer may be from about 100 Å to about 200 Å.

The barrier layer may include silicon nitride and the buffer layer may include silicon oxide.

According to an exemplary embodiment of the present invention, a method of manufacturing a display apparatus includes preparing a substrate including a polymer resin. The method includes implanting dopants through an upper surface of the substrate such that a portion of the substrate including the upper surface of the substrate is doped with $1\times10^{20}$ to $1\times10^{23}$ dopants per 1 $cm^3$. The method includes forming a barrier layer above the upper surface of the substrate. The method includes forming a buffer layer above the barrier layer. The method includes forming a thin film transistor and a display device electrically connected to the thin film transistor above the buffer layer.

The preparing of the substrate may include preparing a substrate including a first polymer resin layer, a second polymer resin layer, and a basic barrier layer between the first polymer resin layer and the second polymer resin layer. The implanting of the dopants may include implanting dopants through an upper surface of the second polymer resin such that a portion of the second polymer resin layer including the upper surface of the second polymer resin layer is doped with $1\times10^{20}$ to $1\times10^{23}$ dopants per 1 $cm^3$.

The preparing of the substrate may include preparing a substrate including a first polymer resin layer, a second polymer resin layer, and a basic barrier layer between the first polymer resin layer and the second polymer resin layer. The implanting of the dopants may include implanting dopants through an upper surface of the second polymer resin such that the second polymer resin layer is substantially completely doped with $1\times10^{20}$ to $1\times10^{23}$ dopants per 1 $cm^3$.

The forming of the barrier layer may include forming a barrier layer including silicon nitride, and the forming of the buffer layer may include forming a buffer layer including silicon oxide.

The method may include activating the implanted dopants through a heat treatment.

According to an exemplary embodiment of the present invention, a method of manufacturing a display apparatus includes preparing a substrate including a polymer resin. The method includes forming a polysilicon layer on the substrate. The method includes implanting dopants into the polysilicon layer such that the polysilicon layer is doped with $1\times10^{20}$ to $1\times10^{23}$ dopants per 1 $cm^3$. The method includes forming a buffer layer on the polysilicon layer. The method includes forming a thin film transistor and a display device electrically connected to the thin film transistor on the buffer layer.

The method may include forming an inorganic insulating layer on the substrate. The polysilicon layer may be formed on the inorganic insulating layer.

The method may include forming a barrier layer on the polysilicon layer. The buffer layer may be formed on the barrier layer.

The barrier layer may be formed to include silicon nitride. The buffer layer may be formed to include silicon oxide.

The method may include forming a barrier layer on the substrate. The method may include forming an inorganic insulating layer on the barrier layer. The polysilicon layer may be formed on the inorganic insulating layer.

The barrier layer may be formed to include silicon nitride. The buffer layer may be formed to include silicon oxide.

The polysilicon layer may be formed to have a thickness of from about 100 Å to about 200 Å.

The method may include activating the implanted dopants through a heat treatment.

According to an exemplary embodiment of the present invention, a display apparatus includes a substrate including a first polymer resin layer. A barrier layer is disposed directly on the first polymer resin layer. A second polymer resin layer is disposed directly on the barrier layer. An upper portion of the second polymer resin layer spaced apart from the barrier layer is doped with $1\times10^{20}$ to $1\times10^{23}$ dopants per 1 cm$^3$. An interlayer insulating layer is disposed on the second polymer resin layer. A thin film transistor is disposed on the interlayer insulating layer. A display device is positioned above the thin film transistor. The display device is electrically connected to the thin film transistor.

According to an exemplary embodiment of the present invention, a display apparatus capable of increasing image quality and a method of manufacturing the display apparatus may be realized. However, the scope of the exemplary embodiments of the present invention are not limited thereto.

BRIEF DESCRIPTION OF THE DRAWINGS

A more complete appreciation of the present invention will become more apparent by describing in detail exemplary embodiments thereof with reference to the accompanying drawings, in which.

DETAILED DESCRIPTION

Figure 1:
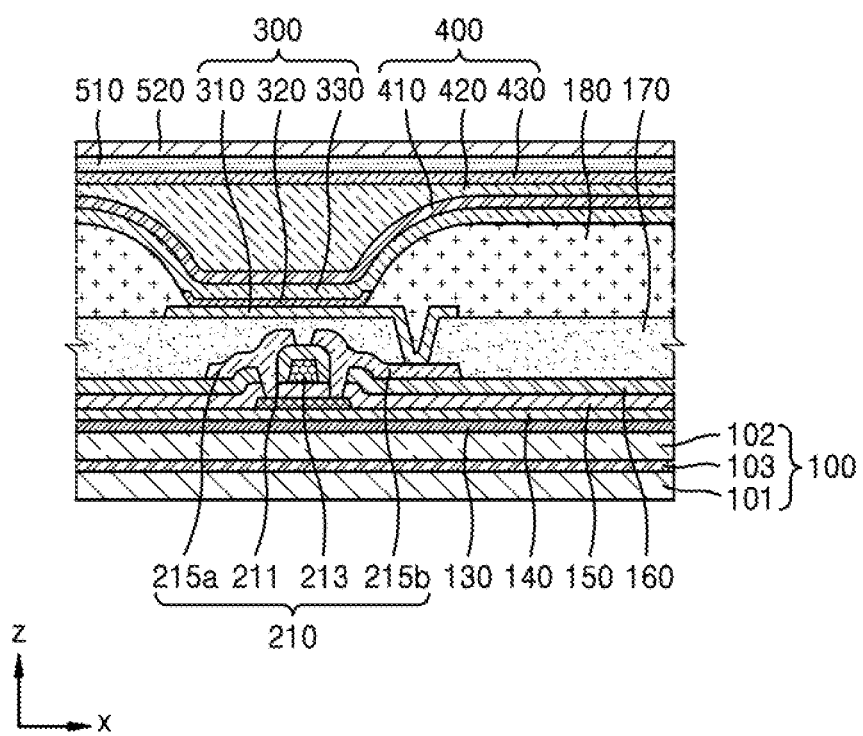
FIG. 1 is a schematic cross-sectional view of a portion of a display apparatus according to an exemplary embodiment of the present invention.

Exemplary embodiments of the present invention will be described below in more detail with reference to the accompanying drawings. In this regard, the exemplary embodiments may have different forms and should not be construed as being limited to the exemplary embodiments of the present invention described herein. Like reference numerals may refer to like elements throughout the specification and drawings.

It will be understood that when a component, such as a layer, a film, a region, or a plate, is referred to as being "on" another component, the component may be directly on the other component or intervening components may be present.

Descriptions of technical features or aspects of an exemplary embodiment of the present invention should typically be considered as available and applicable to other similar features or aspects in another exemplary embodiment of the present invention. Accordingly, technical features described herein according to one exemplary embodiment of the present invention may be applicable to other exemplary embodiments of the present invention, and thus duplicative descriptions may be omitted herein.

Herein, the X-axis, the Y-axis and the Z-axis are not limited to the three axes of the rectangular coordinate system and may be interpreted in a broader sense. In an exemplary embodiment of the present invention, the X-axis, the Y-axis, and the Z-axis may be perpendicular to one another or may represent different directions that are not perpendicular to one another. For example, the X-axis may be perpendicular to the Y-axis. The X-axis and the Y-axis may define a plane along which the substrate 100 extends. A Z-axis may be perpendicular to the first and second axes X and Y. Thus, the Z-axis may be orthogonal to a plane extending in the X and Y axes. A thickness described herein may refer to a thickness along the Z-axis direction.

Figure 2:
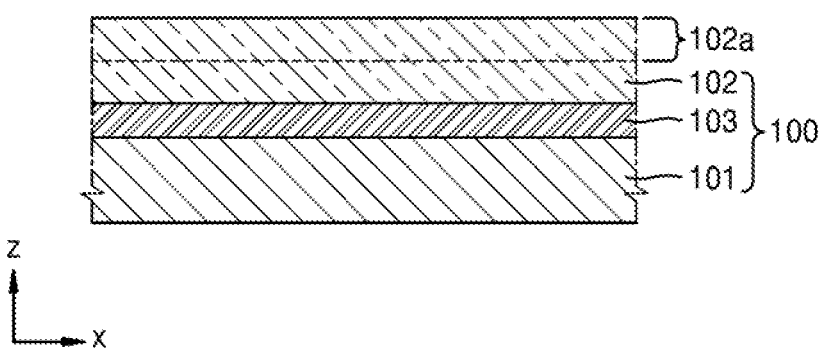
FIG. 2 is a schematic cross-sectional view of a portion of FIG. 1.

FIG. 1 is a schematic cross-sectional view of a portion of a display apparatus according to an exemplary embodiment of the present invention. FIG. 2 is a schematic cross-sectional view of a portion of FIG. 1. The display apparatus according to an exemplary embodiment of the present invention includes a substrate 100 and various components arranged on the substrate 100.

The substrate 100 may have flexible or bendable characteristics. For example, the substrate 100 may be a bendable or foldable substrate that is in a curved or bent state at some times and is in a substantially flat state at other times. Alternatively, the substrate 100 may be in a permanently folded, curved or bent state. The substrate 100 may include various materials and may include, for example, a polymer resin, such as polyether sulphone (PES), polyacrylate (PAR), polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

The substrate 100 may have various structures and may have a multi-layered structure (see, e.g., FIG. 1). The substrate 100 may include a first polymer resin layer 101, a second polymer resin layer 102, and a basic barrier layer 103 therebetween. The first polymer resin layer 101 and/or the second polymer resin layer 102 may include a polymer resin as described above and may include a same material. For example, each of the first polymer resin layer 101 and the second polymer resin layer 102 may include polyimide. The basic barrier layer 103 between the first polymer resin layer 101 and the second polymer resin layer 102 may include an inorganic material and may include, for example, silicon oxide or silicon nitride.

Since the substrate 100 includes the first polymer resin layer 101 and the second polymer resin layer 102, the substrate 100 may have a flexible characteristic as a whole. Since the substrate 100 includes the basic barrier layer 103 between the first polymer resin layer 101 and the second polymer resin layer 102, the basic barrier layer 103 may prevent impurities, such as moisture or oxygen from the outside, from penetrating through the first polymer resin layer 101 and permeating into the second polymer resin layer 102. Thus, it is possible to effectively prevent impurities from the outside from penetrating through the substrate 100 and permeating into various components over or above the substrate 100, which may cause defects. Thus, the substrate 100 described herein may be employed in a device, such as a display device, having increased reliability and a reduced error or defect rate.

In the substrate 100, a portion of the substrate including an upper surface of the substrate 100 (e.g., an upper surface facing along the Z-axis direction in a +z direction) may be doped with dopants. For example, the portion including the upper surface of the substrate 100 may be doped with $1\times10^{20}$ to $1\times10^{23}$ dopants per 1 cm$^3$. For example, boron or phosphorous may be used as the dopants. In a manufacturing process of the display apparatus, a heat treatment may be performed to activate dopants after dopant doping. For example, at an ambient temperature of about 400° C. for about 30 minutes or longer, the dopants may be activated. A same or substantially a same technical feature may be similarly applied to other exemplary embodiments of the present invention. Thus, duplicative descriptions may be omitted below.

According to an exemplary embodiment of the present invention, a portion of the substrate 100 below the portion of the substrate 100 including the upper surface of the substrate 100 (e.g., a portion relatively closer to the basic barrier layer 103) might not be doped.

A thickness of the second polymer resin layer 102 (e.g., in the Z-axis direction) in the substrate 100 may be substantially the same as a thickness of the first polymer resin layer 101. The upper surface (e.g., facing along the Z-axis direction in the +z direction) of the second polymer resin layer 102 and a portion 102a of the second polymer resin layer 102 near the upper surface may be doped with $1\times10^{20}$ to $1\times10^{23}$ dopants per 1 cm$^3$ (see, e.g., FIG. 2). A portion of the second polymer resin layer 102 relatively closer to the basic barrier layer 103 and not including the portion 102a might not be doped with dopants. Alternatively, a doping concentration of the portion of the second polymer resin layer 102 relatively closer to the basic barrier layer 103 may be lower than a doping concentration in the portion 102a near the upper surface. The second polymer resin layer 102 may be substantially completely doped. For example, when the thickness of the second polymer resin layer 102 is relatively small (e.g., is smaller than the thickness of the first polymer resin layer 101), the second polymer resin layer 102 may be substantially completely doped with $1\times10^{20}$ to $1\times10^{23}$ dopants per 1 cm$^3$. For example, the second polymer resin layer 102 may have a thickness of about 100 Å or more.

A barrier layer 130 may be located on the substrate 100 and a buffer layer 140 may be located on the barrier layer 130. The barrier layer 130 may be in direct contact with the substrate 100. The buffer layer 140 may be in direct contact with the barrier layer 130. The barrier layer 130 and the buffer layer 140 may each include an inorganic insulating material. For example, the barrier layer 130 may include silicon nitride and the buffer layer 140 may include silicon oxide. The barrier layer 130 may prevent a material or impurities in the substrate 100 from penetrating into components over or above the substrate 100, which may cause defects. When the barrier layer 130 includes silicon nitride, SiH$_4$ gas and NH$_3$ gas may be used to form the barrier layer 130, or SiH$_4$ gas and N$_2$ gas may be used to form the barrier layer 130. In this case, since the barrier layer 130 includes hydrogen, the barrier layer 130 may be referred to as a hydrogenated silicon nitride layer. Thus, it may be desirable to prevent the hydrogen in the barrier layer 130 from penetrating into various components over or above the barrier layer 130, which may deteriorate the various components. The buffer layer 140 including silicon oxide may prevent or suppress an upward movement of hydrogen in the barrier layer 130. For example, the buffer layer 140 may reduce or eliminate a movement of hydrogen along the Z-axis direction.

A thin film transistor 210 and a display device electrically connected to the thin film transistor 210 may be located on the buffer layer 140. A display device, such as an organic light-emitting device 300 may be positioned over or above the substrate 100. However, exemplary embodiments of the present invention are not limited thereto, and the display apparatus may include various display devices such as liquid crystal devices. As an example, a display apparatus having the organic light-emitting device 300 as a display device will be described below; however, exemplary embodiments of the present invention are not limited thereto. The organic light-emitting device 300 may be electrically connected to the thin film transistor 210. The organic light-emitting device 300 electrically connected to the thin film transistor 210 may include a pixel electrode 310 electrically connected to the thin film transistor 210. As an example, the pixel electrode 310 may penetrate the planarization layer 170. The pixel electrode 310 may be in direct contact with an upper surface of the thin film transistor 210 (e.g., may be in direct contact with drain electrode 215b of the thin film transistor 210).

The thin film transistor 210 may include a semiconductor layer 211 including amorphous silicon, polycrystalline silicon, or an organic semiconductor material, a gate electrode 213, a source electrode 215a, and a drain electrode 215b. A gate insulating layer 150 may be between the semiconductor layer 211 and the gate electrode 213. The gate insulating layer 150 may separate the semiconductor layer 211 and the gate electrode 213 from each other, and may insulate the semiconductor layer 211 and the gate electrode 213 from each other. The gate insulating layer 150 may include an inorganic material, such as silicon oxide, silicon nitride, and/or silicon oxynitride. An interlayer insulating layer 160 may be positioned over or above the gate insulating layer 150. The interlayer insulating layer 160 may be adjacent to the gate electrode 213. The interlayer insulating layer 160 may include an inorganic material, such as silicon oxide, silicon nitride, and/or silicon oxynitride. The source electrode 215a and the drain electrode 215b may be on the interlayer insulating layer 160. For example the source electrode 215a and the drain electrode 215b may be in direct contact with the interlayer insulating layer 160. The interlayer insulating layer 160 and/or the gate insulating layer 150 including an inorganic material may be formed via chemical vapor deposition (CVD) or atomic layer deposition (ALD). A same or substantially a same technical feature may be similarly applied to other exemplary embodiments of the present invention. Thus, duplicative descriptions may be omitted below.

A planarization layer 170 may be on the thin film transistor 210. For example, when an organic light-emitting device 300 is over or above the thin film transistor 210, the planarization layer 170 may planarize an upper portion of a protection layer that covers the thin film transistor 210. The planarization layer 170 may include an organic material, such as benzocyclobutene (BCB) or hexamethyldisiloxane (HMDSO). Although the planarization layer 170 may be a single layer, various modifications may be made to the planarization layer 170. In an exemplary embodiment of the present invention, the planarization layer 170 may be a stack of multiple layers.

The organic light-emitting device 300 may be located on the planarization layer 170, and may have a pixel electrode 310, an opposite electrode 330, and an intermediate layer 320 between the pixel electrode 310 and the opposite electrode 330 and including an emission layer. The pixel electrode 310 may be in direct contact with one of the source electrode 215a and the drain electrode 215b via an opening formed in the planarization layer 170. Thus, the pixel electrode may be electrically connected to the thin film transistor 210.

A pixel-defining layer 180 may be on the planarization layer 170. For example, the pixel-defining layer 180 may be in direct contact with the planarization layer 170. The pixel-defining layer 180 may include an opening in a position corresponding to each sub-pixel, for example, an opening via in which at least a center portion of the pixel electrode 310 is exposed, to define a pixel. As an example, the pixel-defining layer 180 may reduce or eliminate an occurrence of an arc on an edge of the pixel electrode 310 by increasing a distance between the edge of the pixel electrode 310 and the opposite electrode 330 located over or above the pixel electrode 310. For example, outermost edges of the pixel electrode 310 may be spaced apart from the opposite electrode 330 and the pixel defining layer 180 may cover the outermost edges of the pixel defining layer 180. The pixel-defining layer 180 may include an organic material, for example, PI or HMDSO.

The intermediate layer 320 of the organic light-emitting device 300 may include a relatively low-molecular or relatively high-molecular weight material. When the intermediate layer 320 includes a relatively low-molecular weight material, the intermediate layer 320 may have a structure in which a hole injection layer (HIL), a hole transport layer (HTL), an emission layer (EML), an electron transport layer (ETL), and/or an electron injection layer (EIL) are stacked, and may include various organic materials, such as copper phthalocyanine (CuPc), N,N-Di(naphthalen-1-yl)-N,N'-diphenyl-benzidine (NPB), or tris-8-hydroxyquinoline aluminum (Alq3). The intermediate layer 320 may be formed by vacuum deposition.

When the intermediate layer 320 includes a relatively high-molecular weight material, the intermediate layer 320 may have a structure including an HTL and an EML. In this case, the HTL may include poly(3,4-ethylenedioxythiophene) (PEDOT), and the EML may include a relatively high-molecular weight material such as a polyphenylenevinylene (PPV)-based material or a polyfluorene-based material. The intermediate layer 320 may be formed by screen printing, inkjet printing, or laser induced thermal imaging (LITI), for example.

The intermediate layer 320 is not limited to the above-described structure and may have any of various other structures. The intermediate layer 320 may include a single layer that covers a plurality of pixel electrodes 310 or may include patterned layers in positions respectively corresponding to the plurality of pixel electrodes 310.

The opposite electrode 330 may be on the intermediate layer 320. The opposite electrode 330 may be in direct contact with the intermediate layer 320. The opposite electrode 330 may include a single body including a plurality of organic light-emitting devices and thus may be positioned to correspond to the plurality of pixel electrodes 310. For example, opposite electrodes may be respectively disposed on each pixel electrode of the plurality of pixel electrodes 310.

The organic light-emitting device 300 may be damaged by external moisture or oxygen, and thus, an encapsulation layer 400 may substantially cover and protect the organic light-emitting device 300. For example, the encapsulation layer 400 may include a first inorganic encapsulation layer 410, an organic encapsulation layer 420, and a second inorganic encapsulation layer 430.

The first inorganic encapsulation layer 410 may substantially cover the opposite electrode 330 and may include silicon oxide, silicon nitride, and/or silicon oxynitride. The first inorganic encapsulation layer 410 may be in direct contact with the opposite electrode 330. Other layers such as a capping layer may be between the first inorganic encapsulation layer 410 and the opposite electrode 330. The first inorganic encapsulation layer 410 may be conformally formed along a structure thereunder (e.g., the opposite electrode 330), and thus an upper surface of the first inorganic encapsulation layer 410 might not be flat (see, e.g., FIG. 1). The organic encapsulation layer 420 may substantially cover the first inorganic encapsulation layer 410. The organic encapsulation layer 420 may be in direct contact with the first inorganic encapsulation layer 410. The organic encapsulation layer 420 may have a substantially flat upper surface. The organic encapsulation layer 420 may include one or more materials selected from PET, PEN, PC, PI, polyethylene sulfonate, polyoxymethylene, PAR, or hexamethyldisiloxane. The second inorganic encapsulation layer 430 may substantially cover the organic encapsulation layer 420 and may include silicon oxide, silicon nitride, and/or silicon oxynitride. The second inorganic encapsulation layer 430 may be in direct contact with the organic encapsulation layer 420. A portion of the second inorganic encapsulation layer 430, located outside a display area, may be in direct contact with the first inorganic encapsulation layer 410, which may prevent the organic encapsulation layer 420 from being exposed to the outside.

Since the encapsulation layer 400 includes the first inorganic encapsulation layer 410, the organic encapsulation layer 420 and the second inorganic encapsulation layer 430, it is possible to prevent a crack from being connected between the first inorganic encapsulation layer 410 and the organic encapsulation layer 420 or between the organic encapsulation layer 420 and the second inorganic encapsulation layer 430 even if the crack occurs in a layer of the encapsulation layer 400. Thus, it is possible to prevent or suppress the formation of a path through which moisture or oxygen from the outside penetrates into a display device. For example, a crack occurring in one layer of the encapsulation layer 400 might not be propagated to other layers of the encapsulation layer 400.

A touch electrode having various patterns for a touch screen function or a touch protection layer for protecting the touch electrode may be located on the encapsulation layer 400. A polarizing plate 520 may be on the encapsulation layer 400. The polarizing plate 520 may be adhered to the encapsulation layer 400 by an optically clear adhesive (OCA) 510.

The polarizing plate 520 may reduce external light reflection. For example, when external light passes through the polarizing plate 520 and then passes through the polarizing plate 520 again after being reflected from an upper surface of the opposite electrode 330, a phase of the external light may be changed as the external light passes through the polarizing plate 520 twice. As a result, a phase of a reflected light may be different from the phase of the external light entering the polarizing plate 520 and thus extinction interference may occur. As a result, visibility may be increased by reducing external light reflection.

The display apparatus according to an exemplary embodiment of the present invention might not include the polarizing plate 520 and may include a component other than the polarizing plate 520. For example, a black matrix and a color filter may be provided to reduce external light reflection in the display apparatus.

The display apparatus according to an exemplary embodiment of the present invention may increase the quality of an image displayed. For example, in the case of a general display apparatus, when a display area is divided into a plurality of areas and a white image is displayed in all of the plurality of areas after a so-called black/white chess pattern is displayed for a certain time by displaying a black image in some areas spaced apart from each other and displaying a white image in areas therebetween, the brightness of the areas where the black image is displayed may be different from the brightness of the areas where the white image is displayed. As an example, even if the same electrical signal is applied to all areas, some areas may emit light having a brightness that is different from the brightness of light emitted by the other areas. This may lead to deterioration of image quality of an image displayed by the display apparatus.

However, in the case of the display apparatus according to an exemplary embodiment of the present invention, degradation of image quality may be reduced or eliminated. As described above, for example, in the substrate 100 provided in the display apparatus according to an exemplary embodiment of the present invention, a portion of the substrate 100 including the upper surface of the substrate 100 (e.g., a surface facing toward the thin film transistor 210 along the Z-axis) may be doped with $1 \times 10^{23}$ to $1 \times 10^{23}$ dopants per 1 cm$^3$, Accordingly, an influence from the outside of the thin film transistor 210, which may change electrical characteristics of the thin film transistor 210, may be effectively prevented or reduced.

In the display apparatus according to an exemplary embodiment of the present invention, when a black/white chess pattern is displayed for a time as described above, a dipole moment aligned in a certain direction may be induced in the second polymer resin layer 102 of the substrate 100 via an electrical signal that lasts for a certain period of time in the thin film transistor 210 or an interconnection line, located over or above the substrate 100. A dipole moment induced in areas of the second polymer resin layer 102 corresponding to the areas where the black image is displayed may be different from a dipole moment induced in areas of the second polymer resin layer 102 corresponding to the areas where the white image is displayed.

Since the second polymer resin layer 102 is located adjacent to the semiconductor layer 211 of the thin film transistor 210, a dipole moment aligned in a certain direction in the second polymer resin layer 102 may affect a threshold voltage of the thin film transistor 210 and may cause a shift in the threshold voltage. Thus, a threshold voltage shift of the thin film transistor 210 in the areas where the black image is displayed may be different from a threshold voltage shift of the thin film transistor 210 in the areas where the white image is displayed. As a result, even if an electrical signal is applied to display devices to display a white image in all areas, the brightness of the areas where the black image is displayed may be different from the brightness of the areas where the white image is displayed.

However, in the substrate 100 provided in the display apparatus according to an exemplary embodiment of the present invention, a portion of the substrate 100 including the upper surface of the substrate 100 may be doped with $1 \times 10^{20}$ to $1 \times 10^{23}$ dopants per 1 cm$^3$. As a result, the portion including the upper surface of the substrate 100 becomes conductive, and an electrical signal in the thin film transistor 210 or an interconnection line, located over or above the substrate 100, may be shielded by the portion including the upper surface of the substrate 100. Accordingly, it is possible to prevent a dipole moment, which is aligned in a certain direction, from being formed in the first polymer resin layer 101 and/or the second polymer resin layer 102, included in the substrate 100, and thus, it is possible to effectively prevent deterioration in image quality.

As described above, in the display apparatus according to an exemplary embodiment of the present invention, the portion of the substrate 100 including the upper surface of the substrate 100 may be doped with $1 \times 10^{20}$ to $1 \times 10^{23}$ dopants per 1 cm$^3$. When the doping concentration in the portion including the upper surface of the substrate 100 is less than $1 \times 10^{20}$ per 1 cm$^3$, the conductivity of the portion including the upper surface of the substrate 100 is lowered and thus an electrical signal in the thin film transistor 210 or an interconnection line, located over or above the substrate 100, might not be sufficiently shielded. When the doping concentration in the portion including the upper surface of the substrate 100 is greater than $1 \times 10^{23}$ per 1 cm$^3$, the performance of the thin film transistor 210 over or above the substrate 100 is affected as the doping concentration in the portion including the upper surface of the substrate 100 becomes excessively high. For example, when the thin film transistor 210 is a p-type thin film transistor and the doping concentration is greater than $1 \times 10^{23}$ per 1 cm$^3$, the threshold voltage of the thin film transistor 210 becomes negative, and as a result, the thin film transistor 210 might not operate as desired. Thus, it is desirable that the portion including the upper surface of the substrate 100 is doped with $1 \times 10^{20}$ to $1 \times 10^{23}$ dopants per 1 cm$^3$. A same or substantially a same technical feature may be similarly applied to other exemplary embodiments of the present invention. Thus, duplicative descriptions may be omitted below.

As described above, the substrate 100 may include the first polymer resin layer 101, the second polymer resin layer 102, and the basic barrier layer 103 therebetween. In this case, the second polymer resin layer 102 may be adjacent to the barrier layer 130, and thus, the thickness of the second polymer resin layer 102 may be about 100 Å or more. For example, the second polymer resin layer 102 may be relatively closer to the barrier layer 130 than the first polymer resin layer 101 or the basic barrier layer 103.

When the thickness of the second polymer resin layer 102 is less than 100 Å, even if dopants are sufficiently implanted into the second polymer resin layer 102, some of the dopants may be implanted into the basic barrier layer 103 under the second polymer resin layer 102. In this case, dopants implanted into the basic barrier layer 103 are not conductive in the basic barrier layer 103 including silicon oxide and/or silicon nitride and thus do not shield an electrical signal in the thin film transistor 210 or an interconnection line, located over or above the substrate 100. As a result, a dipole moment aligned in a certain direction may be formed in the second polymer resin layer 102, and the dipole moment may affect the thin film transistor 210, thus causing image quality degradation. Thus, it is desirable that the thickness of the second polymer resin layer 102 is 100 Å or more so that implanted dopants are present in the second polymer resin layer 102 without being implanted into the basic barrier layer 103. A same or substantially a same technical feature may be similarly applied to other exemplary embodiments of the present invention. Thus, duplicative descriptions may be omitted below.

When the thickness of the second polymer resin layer 102 is about 100 Å, the second polymer resin layer 102 may be substantially completely doped with $1 \times 10^{20}$ to $1 \times 10^{23}$ dopants per 1 cm$^3$. When the thickness of the second polymer resin layer 102 is greater than 100 Å, the upper surface (e.g., a surface of the second polymer resin layer facing along the Z-axis in a +z direction away from the basic barrier layer 103) of the second polymer resin layer 102 and the portion 102a near the upper surface may be doped with $1 \times 10^{20}$ to $1 \times 10^{23}$ dopants per 1 cm$^3$, and a portion of the second polymer resin layer 102 other than the portion 102a toward the basic barrier layer 103 might not be doped with dopants. Alternatively, a doping concentration of the portion of the second polymer resin layer 102 other than the portion 102a may be lower than a doping concentration in the upper surface of the second polymer resin layer 102 and the portion 102a near the upper surface of the second polymer resin layer 102. A same or substantially a same technical feature may be similarly applied to other exemplary embodiments of the present invention. Thus, duplicative descriptions may be omitted below.

According to an exemplary embodiment of the present invention, a display apparatus may include the substrate 100 including the first polymer resin layer 101. A barrier layer (e.g., basic barrier layer 103) may be disposed directly on the first polymer resin layer 101. The second polymer resin layer 102 may be disposed directly on the barrier layer. An upper portion (e.g., portion 102a) of the second polymer resin layer 102 spaced apart from the barrier layer may be doped with $1 \times 10^{20}$ to $1 \times 10^{23}$ dopants per 1 cm$^3$. An interlayer insulating layer (e.g., interlayer insulating layer 160) may be disposed on the second polymer resin layer 102. The thin film transistor 210 may be disposed on the interlayer insulating layer. A display device (e.g., OLED 300) may be positioned above the thin film transistor 210. The display device may be electrically connected to the thin film transistor 210.

Figure 3:
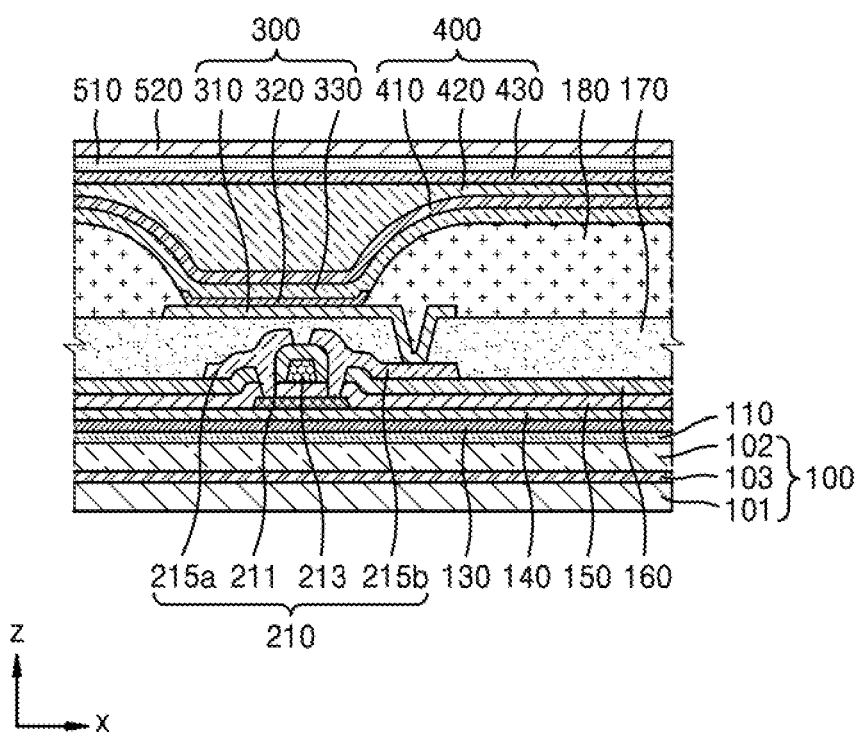
FIG. 3 is a schematic cross-sectional view of a portion of a display apparatus according to an exemplary embodiment of the present invention.

FIG. 3 is a schematic cross-sectional view of a portion of a display apparatus according to an exemplary embodiment of the present invention. The display apparatus according to an exemplary embodiment of the present invention described below with reference to FIG. 3 may be different from the display apparatus according to an exemplary embodiment of the present invention described above with reference to FIGS. 1 and 2 in that the substrate 100 is not doped with dopants. The display apparatus according to an exemplary embodiment of the present invention further includes a polysilicon layer 110 between the substrate 100 and the barrier layer 130. The polysilicon layer 110 may be doped with $1 \times 10^{20}$ to $1 \times 10^{23}$ dopants per 1 cm$^3$, Boron or phosphorous may be used as the dopants. A same or substantially a same technical feature may be similarly applied to other exemplary embodiments of the present invention. Thus, duplicative descriptions may be omitted below.

In the display apparatus according to an exemplary embodiment of the present invention, the polysilicon layer 110 doped with dopants may function as the substrate 100 doped with dopants described in more detail above with reference to FIGS. 1 and 2. As an example, the polysilicon layer 110 is conductive and thus an electrical signal in the thin film transistor 210 or an interconnection line, located over or above the substrate 100, may be shielded by the portion including the upper surface of the substrate 100. Accordingly, it is possible to prevent a dipole moment, which is aligned in a certain direction, from being formed in the first polymer resin layer 101 and/or the second polymer resin layer 102 in the substrate 100, and thus, it is possible to effectively prevent deterioration in image quality.

Also, in the case of the display apparatus according to an exemplary embodiment of the present invention, the doping concentration of the polysilicon layer 110 may be $1 \times 10^{20}$ to $1 \times 10^{23}$. When the doping concentration is less than $1 \times 10^{20}$ per 1 cm$^3$, the conductivity of the polysilicon layer 110 is lowered and thus an electrical signal in the thin film transistor 210 and an interconnection layer, located on the substrate 100, might not be sufficiently shielded. When the doping concentration is greater than $1 \times 10^{23}$ per 1 cm$^3$, the performance of the thin film transistor 210 on the polysilicon layer 110 may be affected for the same reason as described above. Thus, it is desirable that the polysilicon layer 110 is doped with $1 \times 10^{20}$ to $1 \times 10^{23}$ dopants per 1 cm$^3$. A same or substantially a same technical feature may be similarly applied to other exemplary embodiments of the present invention. Thus, duplicative descriptions may be omitted below.

The thickness of the polysilicon layer 110 may be from about 100 Å to about 200 Å. When the thickness of the polysilicon layer 110 is less than 100 Å, even if dopants are sufficiently implanted into the polysilicon layer 110, some of the dopants may move to a component under the polysilicon layer 110 rather than the polysilicon layer 110, In this case, the polysilicon layer 110 might not have sufficient conductivity, and thus might not shield an electrical signal in the thin film transistor 210 or an interconnection layer, located over or above the substrate 100. As a result, a dipole moment aligned in a certain direction may be formed in the substrate 100 under the polysilicon layer 110, and the dipole moment may affect the thin film transistor 210, thus causing image quality degradation. Thus, it is desirable that the thickness of the polysilicon layer 110 is 100 Å or more.

It is desirable that the thickness of the polysilicon layer 110 is 200 Å or less. The polysilicon layer 110 might not have high transmittance, and thus, when the thickness of the polysilicon layer 110 is greater than 200 Å, it might not be possible to observe an optical structure over the polysilicon layer 110 through the polysilicon layer 110, For example, the semiconductor layer 211 including polysilicon may be located on the buffer layer 140 over or above the polysilicon layer 110, and when the semiconductor layer 211 is formed, a marker having a predetermined shape such as a "+" shape may be formed (e.g., may be substantially simultaneously formed) on a same layer and with a same material as the semiconductor layer 211. When the gate electrode 213, the source electrode 215a, the drain electrode 215b, and the pixel electrode 310 are formed, the marker may be used to determine relative positions of the substrate 100 and a mask. However, when the thickness of the polysilicon layer 110 is greater than 200 Å, the marker over the polysilicon layer 110 might not be optically observed through the substrate 100 and the polysilicon layer 110, and thus, alignment of the substrate 100 and the mask might not be possible. Thus, it is desirable that the thickness of the polysilicon layer 110 is 200 Å or less.

Thus, the thickness of the polysilicon layer 110 doped with dopants may be in the range of from about 100 Å to about 200 Å. A same or substantially a same technical feature may be similarly applied to other exemplary embodiments of the present invention. Thus, duplicative descriptions may be omitted below.

Figure 4:
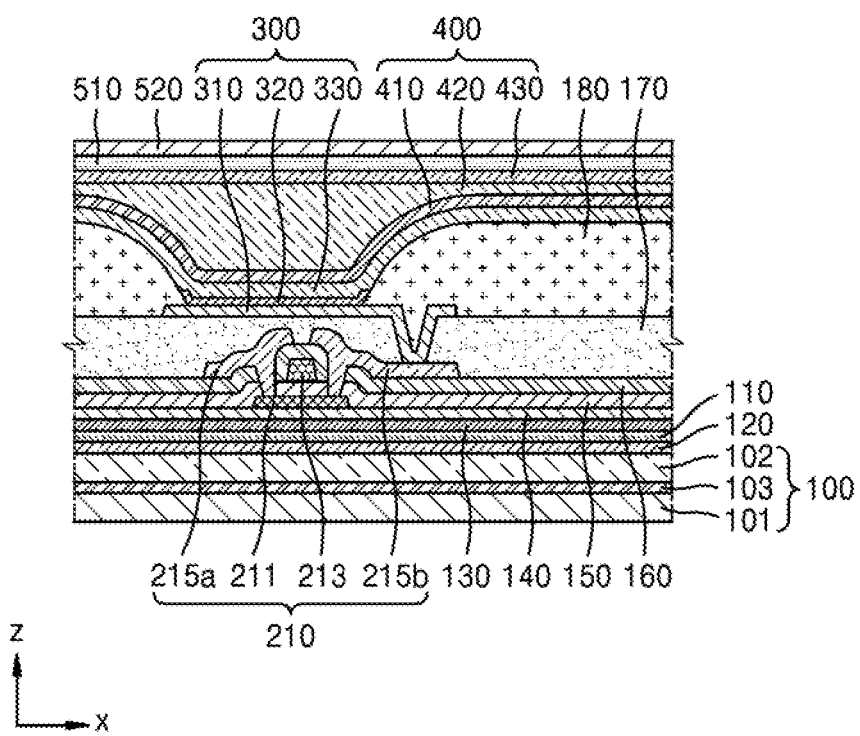
FIG. 4 is a schematic cross-sectional view of a portion of a display apparatus according to an exemplary embodiment of the present invention.

FIG. 4 is a schematic cross-sectional view of a portion of a display apparatus according to an exemplary embodiment of the present invention. The display apparatus according to an exemplary embodiment of the present invention described below with reference to FIG. 4 may be different from the display apparatus according to an exemplary embodiment of the present invention described above with reference to FIG. 3 in that the display apparatus according to an exemplary embodiment of the present invention described below with reference to FIG. 4 may further includes an inorganic insulating layer 120. The inorganic insulating layer 120 may be between the polysilicon layer 110 and the substrate 100. When the polysilicon layer 110 is disposed directly on the substrate 100, peeling may occur during a manufacturing process or a subsequent use because a bonding strength between the polysilicon layer 110 and the substrate 100 may be relatively low. Thus, by positioning the inorganic insulating layer 120, which both has a strong bonding strength with the polysilicon layer 110 and with the second polymer resin layer 102, between the polysilicon layer 110 and the substrate 100, the occurrence of peeling may be prevented or reduced. The inorganic insulating layer 120 may include silicon oxide or silicon nitride.

Figure 5:
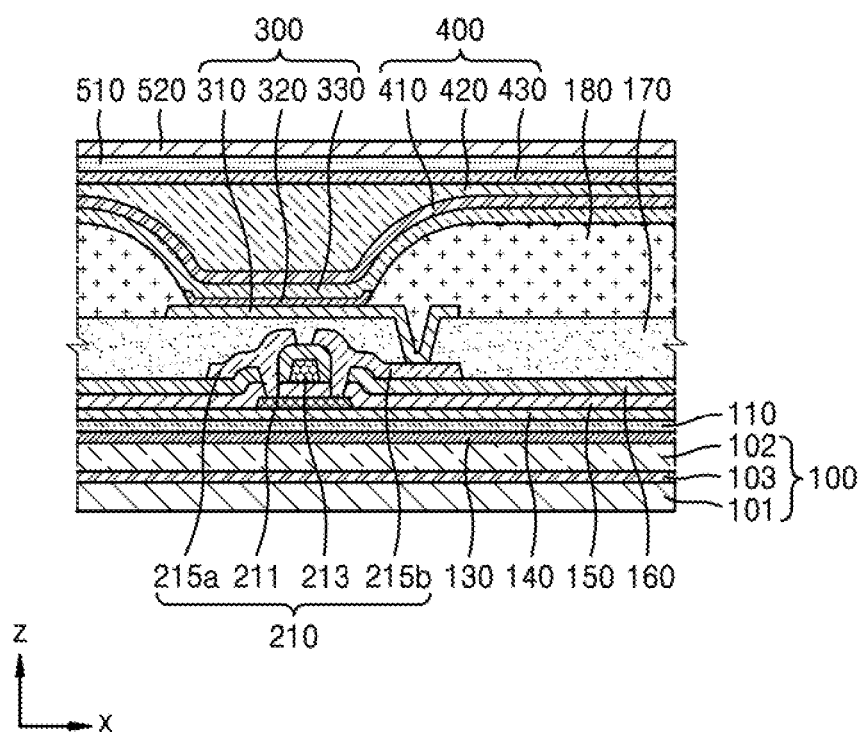
FIG. 5 is a schematic cross-sectional view of a portion of a display apparatus according to an exemplary embodiment of the present invention.

FIG. 5 is a schematic cross-sectional view of a portion of a display apparatus according to an exemplary embodiment of the present invention. The location of the polysilicon layer 110 in the display apparatus according to an exemplary embodiment of the present invention described below with reference to FIG. 5 may be different from the location of the polysilicon layer 110 in the display apparatus according to an exemplary embodiment of the present invention described above with reference to FIG. 3. The display apparatus according to an exemplary embodiment of the present invention described below with reference to FIG. 5 may be different from the display apparatus according to an exemplary embodiment of the present invention described above with reference to FIG. 3 in that the polysilicon layer 110 doped with dopants may be located on the barrier layer 130. The polysilicon layer 110 may be in direct contact with the barrier layer 130. As an example, the barrier layer 130 may be disposed between the polysilicon layer 110 and the substrate 100.

As described above, when the polysilicon layer 110 is placed directly on the substrate 100, peeling may occur during a manufacturing process or a subsequent use because a bonding strength between the polysilicon layer 110 and the substrate 100 may be relatively low. However, in the case of the display apparatus according to an exemplary embodiment of the present invention, since the polysilicon layer 110 doped with dopants is located on the barrier layer 130 including an inorganic insulating material, the polysilicon layer 110 and the barrier layer 130 may be relatively securely bonded to each other. In addition, since the second polymer resin layer 102 of the substrate 100 is in direct contact with the barrier layer 130, the second polymer resin layer 102 and the barrier layer 130 may be more securely bonded to each other, and since the upper surface of the polysilicon layer 110 is in direct contact with the buffer layer 140 including an inorganic insulating material and located on the polysilicon layer 110, the polysilicon layer 110 and the buffer layer 140 may be relatively securely bonded to each other.

Figure 6:
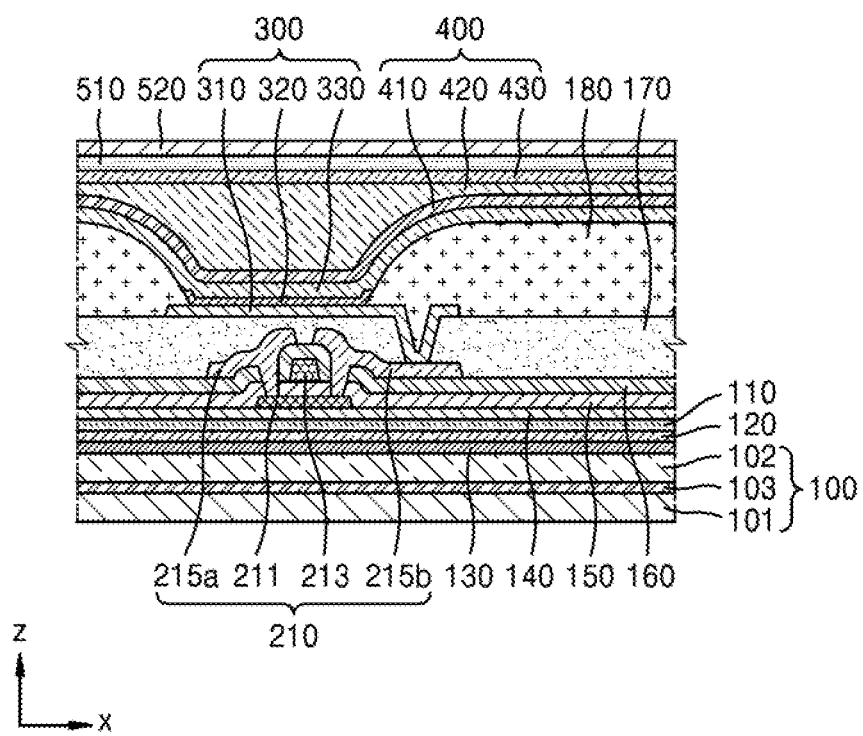
FIG. 6 is a schematic cross-sectional view of a portion of a display apparatus according to an exemplary embodiment of the present invention.

FIG. 6 is a schematic cross-sectional view of a portion of a display apparatus according to an exemplary embodiment of the present invention.

Referring to FIG. 6, unlike the display apparatus according to an exemplary embodiment of the present invention described above with reference to FIG. 5, the display apparatus according to an exemplary embodiment of the present invention described below with reference to FIG. 6 may further include an inorganic insulating layer 120 located between the polysilicon layer 110 and the barrier layer 130 and including silicon nitride or silicon oxide.

Although exemplary embodiments of the present invention have been described above, exemplary embodiments of the present invention are not limited thereto. For example, a method of manufacturing a display apparatus may be employed according to an exemplary embodiment of the present invention.

For example, a display apparatus as described above with reference to FIG. 1 may be manufactured by preparing the substrate 100 including a polymer resin, implanting dopants into the substrate 100 through the upper surface thereof such that a portion including the upper surface of the substrate 100 is doped with $1 \times 10^{20}$ to $1 \times 10^{23}$ dopants per 1 cm$^3$, forming the barrier layer 130 and the buffer layer 140 on an upper surface of the substrate 100 (e.g., sequentially), and then forming the thin film transistor 210 and the organic light-emitting device 300 electrically connected to the thin film transistor 210 on the buffer layer 140. In this case, the barrier layer 130 may be formed to include silicon nitride and the buffer layer 140 may be formed to include silicon oxide. A same or substantially a same technical feature may be similarly applied to other exemplary embodiments of the present invention. Thus, duplicative descriptions may be omitted below. The functions of the barrier layer 130 and the buffer layer 140 may be as described above.

The preparing of the substrate 100 may include preparing the substrate 100 including the first polymer resin layer 101, the second polymer resin layer 102, and the basic barrier layer 103 therebetween. The implanting of the dopants may include implanting dopants into the substrate 100 such that a portion including an upper surface (e.g., in the +z direction) as a part of the second polymer resin layer 102 is doped with $1 \times 10^{20}$ to $1 \times 10^{23}$ dopants per 1 cm$^3$. When the thickness of the second polymer resin layer 102 is sufficiently large, the portion 102a including the upper surface (e.g., in the +z direction) as a part of the second polymer resin layer 102 (see, e.g., FIG. 2), may be doped with $1 \times 10^{20}$ to $1 \times 10^{23}$ dopants per 1 cm$^3$. When the thickness of the second polymer resin layer 102 is about 100 Å, dopants may be implanted such that the second polymer resin layer 102 is substantially completely doped with $1 \times 10^{20}$ to $1 \times 10^{23}$ dopants per 1 cm$^3$.

After the dopants are implanted in this manner, a heat treatment may be performed to activate the implanted dopants. For example, at an ambient temperature of 400° C. for 30 minutes or longer, the implanted dopants may be activated. A same or substantially a same technical feature may be similarly applied to other exemplary embodiments of the present invention. Thus, duplicative descriptions may be omitted below. The heat treatment may be performed immediately after the dopants are implanted, and thus, the implanted dopants may be reliably activated. A same or substantially a same technical feature may be similarly applied to other exemplary embodiments of the present invention. Thus, duplicative descriptions may be omitted below.

Exemplary embodiments of the present invention are not limited to the particular embodiments described herein, and various other modifications are possible. For example, a display apparatus as described with reference to FIG. 3 may be manufactured by preparing the substrate 100 including a polymer resin, forming the polysilicon layer 110 on the substrate 100, implanting dopants into the polysilicon layer 110 through an upper surface thereof such that the polysilicon layer 110 is doped with $1\times10^{20}$ to $1\times10^{23}$ dopants per 1 cm$^3$, sequentially forming the barrier layer 130 and the buffer layer 140 on the polysilicon layer 110, and then forming the thin film transistor 210 and the organic light-emitting device 300 electrically connected to the thin film transistor 210 on the buffer layer 140.

In this case, since a bonding strength between the polysilicon layer 110 and the substrate 100 including the second polymer resin layer 102 may be relatively low, the inorganic insulating layer 120 may be formed on the substrate 100 before the polysilicon layer 110 is formed (see, e.g., FIG. 4), and the polysilicon layer 110 may be formed on the inorganic insulating layer 120.

A display apparatus as described with reference to FIG. 5 may be manufactured by forming the barrier layer 130 on the substrate 100, forming the polysilicon layer 110 on the barrier layer 130, implanting dopants into the polysilicon layer 110 through an upper surface thereof such that the polysilicon layer 110 is doped with $1\times10^{20}$ to $1\times10^{23}$ dopants per 1 cm$^3$, forming the buffer layer 140 on the polysilicon layer 110, and then forming the thin film transistor 210 and the organic light-emitting device 300 electrically connected to the thin film transistor 210 on the buffer layer 140. To manufacture a display apparatus as described with reference to FIG. 6, the inorganic insulating layer 120 may be formed on the barrier layer 130 before the polysilicon layer 110 is formed, and the polysilicon layer 110 may be formed on the inorganic insulating layer 120.

When display apparatuses as described with reference to FIGS. 3 to 6 are manufactured, the polysilicon layer 110 may be formed to have a thickness of about 100 Å to about 200 Å, which may result in dopants that are sufficiently implanted into the polysilicon layer 110 to have conductivity and which may result in the dopants passing through the substrate 100 and the polysilicon layer 110 during manufacturing processes so that a marker over the polysilicon layer 110 may be easily optically identified.

It should be understood that embodiments described herein should be considered in a descriptive sense and not for purposes of limitation. Descriptions of features or aspects within each embodiment should typically be considered as available for other similar features or aspects in other embodiments.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display apparatus comprising:
   a substrate comprising a polymer resin, wherein a portion of the substrate including an upper surface of the substrate includes the polymer resin and is doped with $1\times10^{20}$ to $1\times10^{23}$ dopants per 1 cm$^3$;
   a barrier layer above the upper surface of the substrate;
   a buffer layer above the barrier layer;
   a thin film transistor above the buffer layer; and
   a display device electrically connected to the thin film transistor.

2. The display apparatus of claim 1, wherein the substrate comprises a first polymer resin layer, a second polymer resin layer, and a basic barrier layer between the first polymer resin layer and the second polymer resin layer,
   wherein the second polymer resin layer is closer to the barrier layer than the first polymer resin layer, and wherein a portion of the second polymer resin layer including an upper surface of the second polymer resin layer is doped with $1\times10^{20}$ to $1\times10^{23}$ dopants per 1 cm$^3$.

3. The display apparatus of claim 1, wherein the substrate comprises a first polymer resin layer, a second polymer resin layer, and a basic barrier layer between the first polymer resin layer and the second polymer resin layer,
   wherein the second polymer resin layer is closer to the barrier layer than the first polymer resin layer, and the second polymer resin layer is substantially completely doped with $1\times10^{20}$ to $1\times10^{23}$ dopants per 1 cm$^3$.

4. The display apparatus of claim 1, wherein the barrier layer comprises silicon nitride and the buffer layer comprises silicon oxide.

5. A display apparatus comprising:
   a substrate comprising a polymer resin;
   a buffer layer positioned above the substrate;
   a polysilicon layer between the substrate and the buffer layer, wherein the polysilicon layer is doped with $1\times10^{20}$ to $1\times10^{23}$ dopants per 1 cm$^3$;
   a thin film transistor positioned above the buffer layer; and
   a display device electrically connected to the thin film transistor,
   wherein a thickness of the polysilicon layer is from about 100 Å to about 200 Å.

6. The display apparatus of claim 5, further comprising an inorganic insulating layer between the polysilicon layer and the substrate.

7. A display apparatus comprising:
   a substrate comprising a polymer resin;
   a buffer layer positioned above the substrate;
   a polysilicon layer between the substrate and the buffer layer, wherein the polysilicon layer is doped with $1\times10^{20}$ to $1\times10^{23}$ dopants per 1 cm$^3$;
   a thin film transistor positioned above the buffer layer;
   a display device electrically connected to the thin film transistor;
   an inorganic insulating layer between the polysilicon layer and the substrate; and
   a barrier layer between the buffer layer and the polysilicon layer.

8. The display apparatus of claim 5, further comprising a barrier layer between the polysilicon layer and the substrate.

9. A display apparatus comprising:
   a substrate comprising a polymer resin;
   a buffer layer positioned above the substrate;
   a polysilicon layer between the substrate and the buffer layer, wherein the polysilicon layer is doped with $1\times10^{20}$ to $1\times10^{23}$ dopants per 1 cm$^3$;
   a thin film transistor positioned above the buffer layer;
   a display device electrically connected to the thin film transistor;
   a barrier layer between the polysilicon layer and the substrate; and
   an inorganic insulating layer between the polysilicon layer and the barrier layer.

10. The display apparatus of claim 7, wherein the barrier layer comprises silicon nitride and the buffer layer comprises silicon oxide.

11. A method of manufacturing a display apparatus, the method comprising:
- preparing a substrate comprising a polymer resin;
- implanting dopants through an upper surface of the substrate such that a portion of the substrate including the upper surface of the substrate includes the polymer resin and is doped with $1 \times 10^{20}$ to $1 \times 10^{23}$ dopants per 1 $cm^3$;
- forming a barrier layer above the upper surface of the substrate;
- forming a buffer layer above the barrier layer; and
- forming a thin film transistor and a display device electrically connected to the thin film transistor above the buffer layer.

12. The method of claim 11, wherein the substrate is prepared to include a first polymer resin layer, a second polymer resin layer, and a basic barrier layer between the first polymer resin layer and the second polymer resin layer,
- wherein the implanting of the dopants comprises implanting dopants through an upper surface of the second polymer resin such that a portion of the second polymer resin layer including the upper surface of the second polymer resin layer is doped with $1 \times 10^{20}$ to $1 \times 10^{23}$ dopants per 1 $cm^3$.

13. The method of claim 11, wherein the substrate is prepared to include a first polymer resin layer, a second polymer resin layer, and a basic barrier layer between the first polymer resin layer and the second polymer resin layer,
- wherein the implanting of the dopants comprises implanting dopants through an upper surface of the second polymer resin such that the second polymer resin layer is substantially completely doped with $1 \times 10^{20}$ to $1 \times 10^{23}$ dopants per 1 $cm^3$.

14. The method of claim 11, wherein the barrier layer is formed to include silicon nitride, and the buffer layer is formed to include silicon oxide.

15. The method of claim 11, further comprising activating the implanted dopants through a heat treatment.

16. A method of manufacturing a display apparatus, the method comprising:
- preparing a substrate comprising a polymer resin;
- forming a polysilicon layer above the substrate;
- implanting dopants into the polysilicon layer such that the polysilicon layer is doped with $1 \times 10^{20}$ to $1 \times 10^{23}$ dopants per 1 $cm^3$;
- forming a buffer layer above the polysilicon layer; and
- forming a thin film transistor and a display device electrically connected to the thin film transistor above the buffer layer,
- wherein the polysilicon layer is formed to have a thickness of from about 100 Å to about 200 Å.

17. The method of claim 16, further comprising forming an inorganic insulating layer above the substrate,
- wherein the polysilicon layer is formed above the inorganic insulating layer.

18. The method of claim 17, further comprising forming a barrier layer above the polysilicon layer,
- wherein the buffer layer is formed above the barrier layer.

19. The method of claim 18, wherein the barrier layer is formed to include silicon nitride, and the buffer layer is formed to include silicon oxide.

20. The method of claim 16, further comprising:
- forming a barrier layer above the substrate; and
- forming an inorganic insulating layer above the barrier layer,
- wherein the polysilicon layer is formed above the inorganic insulating layer.

21. The method of claim 20, wherein the barrier layer is formed to include silicon nitride, and the buffer layer is formed to include silicon oxide.

22. The method of claim 16, further comprising activating the implanted dopants through a heat treatment.

* * * * *